(12) United States Patent
Seike

(10) Patent No.: US 12,463,449 B2
(45) Date of Patent: Nov. 4, 2025

(54) SEMICONDUCTOR DEVICE

(71) Applicant: ROHM CO., LTD., Kyoto (JP)

(72) Inventor: Takeshi Seike, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 143 days.

(21) Appl. No.: 18/394,415

(22) Filed: Dec. 22, 2023

(65) Prior Publication Data

US 2024/0213796 A1    Jun. 27, 2024

(30) Foreign Application Priority Data

Dec. 27, 2022 (JP) ................ 2022-210811

(51) Int. Cl.
*H02J 7/34* (2006.01)
*H02H 9/04* (2006.01)
*H03K 5/22* (2006.01)

(52) U.S. Cl.
CPC ............. *H02J 7/345* (2013.01); *H02H 9/046* (2013.01); *H03K 5/22* (2013.01)

(58) Field of Classification Search
CPC ............ H02J 7/345; H02H 9/046; H03K 5/22

USPC .......................................................... 361/56
See application file for complete search history.

(56) References Cited

U.S. PATENT DOCUMENTS

| | | | |
|---|---|---|---|
| 6,011,415 A * | 1/2000 | Hahn ................... | G11B 5/596 330/288 |
| 2017/0063074 A1* | 3/2017 | Yasusaka ............. | H03K 17/145 |

FOREIGN PATENT DOCUMENTS

| | | | |
|---|---|---|---|
| CN | 103017898 A * | 4/2013 | ............. H03F 3/08 |
| EP | 1599067 A2 * | 11/2005 | ............. H04R 19/04 |
| JP | 2014-075696 | 4/2014 | |

* cited by examiner

*Primary Examiner* — Dharti H Patel
(74) *Attorney, Agent, or Firm* — Fish & Richardson P.C.

(57) ABSTRACT

A semiconductor device includes: a capacitor connection terminal configured to enable an external connection of a capacitor; a charger configured to charge the capacitor; an ESD protector connected to the capacitor connection terminal; and a current injector including a same component which is the same as the ESD protector and is configured to inject a current based on a leakage current flowing through the same component into a charging path where charging is performed by the charger.

9 Claims, 6 Drawing Sheets

SEMICONDUCTOR DEVICE

CROSS-REFERENCE TO RELATED APPLICATION

This application is based upon and claims the benefit of priority from Japanese Patent Application No. 2022-210811, filed on Dec. 27, 2022, the entire contents of which are incorporated herein by reference.

TECHNICAL FIELD

The present disclosure relates to a semiconductor device.

BACKGROUND

It is known in the related art to externally connect a capacitor to an external terminal of a semiconductor device to set characteristics by the capacitor. For example, in the related art, it is disclosed that a capacitor is externally connected to a reset IC to set a delay time by the capacitor.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Exemplary embodiments of the present disclosure will be described below with reference to the drawings.

1. First Embodiment

Herein, as an application example of the present disclosure, a first embodiment and a second embodiment will be described below in a case where the present disclosure is applied to a reset IC. First, prior to describing the first embodiment, a comparative example for comparison will be described. This makes problems of the present disclosure more clear.

Figure 1:
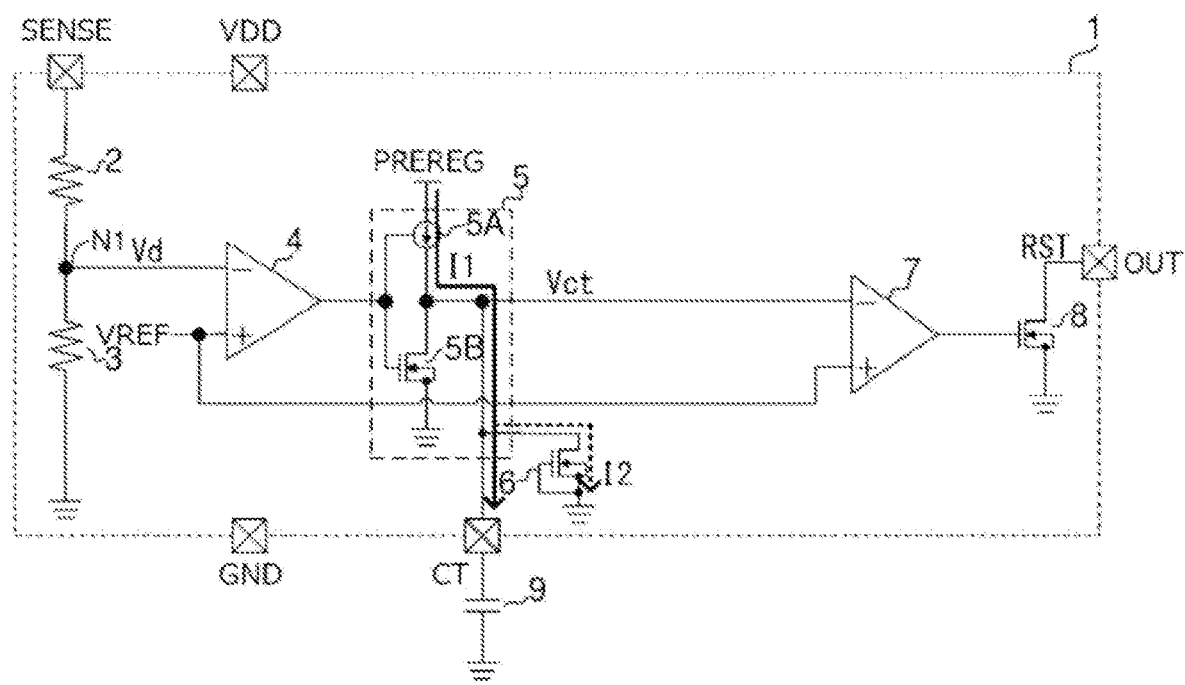
FIG. 1 is a diagram showing a configuration of a semiconductor device according to a comparative example.

FIG. 1 is a diagram showing a configuration of a semiconductor device 1 according to the comparative example. The semiconductor device 1 is a reset IC having an integrated internal configuration shown in FIG. 1. The reset IC is configured to output a reset signal to a microcomputer (not shown) or the like.

The semiconductor device 1 includes voltage divider resistors 2 and 3, a comparator 4, a charger 5, an ESD (Electro-Static Discharge) protector 6, a comparator 7, and an NMOS transistor (N-channel MOSFET (Metal-Oxide-Semiconductor Field Effect Transistor)) (output switch) 8. The semiconductor device 1 further includes a SENSE terminal (detection terminal), a VDD terminal (power supply terminal), a GND terminal (ground terminal), a CT terminal (capacitor connection terminal), and an OUT terminal (output terminal), as external terminals configured to establish electrical connection with the outside. A power supply voltage VDD is externally applied to the VDD terminal. A ground potential is externally applied to the GND terminal.

An application end of the power supply voltage VDD is externally connected to the SENSE terminal. A voltage to be applied to the SENSE terminal is not limited to the power supply voltage and may be any voltage to be monitored. The voltage divider resistors 2 and 3 are connected in series between the SENSE terminal and an application end of the ground potential. An inverting input end (−) of the comparator 4 is connected to a node N1 to which the voltage divider resistors 2 and 3 are connected. A non-inverting input end (+) of the comparator 4 is connected to an application end of a reference voltage VREF.

The charger 5 is configured to charge and discharge a capacitor 9 externally connected to the CT terminal and includes a constant current source 5A and an NMOS transistor 5B. The constant current source 5A is connected between an internal voltage PREREG and a drain of the NMOS transistor 5B. The constant current source 5A and a gate of the NMOS transistor 5B are connected to an output end of the comparator 4. A source of the NMOS transistor 5B is connected to the application end of the ground potential. The drain of the NMOS transistor 5B is connected to the CT terminal and also to an inverting input end of the comparator 7. A non-inverting input end of the comparator 7 is connected to the application end of the reference voltage VREF. A gate of the NMOS transistor 8 is connected to an output end of the comparator 7. A source of the NMOS transistor 8 is connected to the application end of the ground potential. A drain of the NMOS transistor 8 is connected to the OUT terminal. The OUT terminal is connected to a pull-up resistor (not shown) and also to a microcomputer or the like (not shown).

A reset signal RST is output from the OUT terminal. The reset signal RST is at a high level when the NMOS transistor 8 is turned off, and is at a low level when it is turned on.

The ESD protector 6 includes an NMOS transistor whose gate and source are short-circuited. A drain of the ESD protector 6 is connected to the CT terminal. A source of the ESD protector 6 is connected to the application end of the ground potential. The ESD protector 6 is configured to suppress a malfunction caused by static electricity input from the CT terminal. The ESD protector 6 is not limited to the configuration shown in FIG. 1 but may be configured with, for example, a Zener diode or the like.

Figure 2:
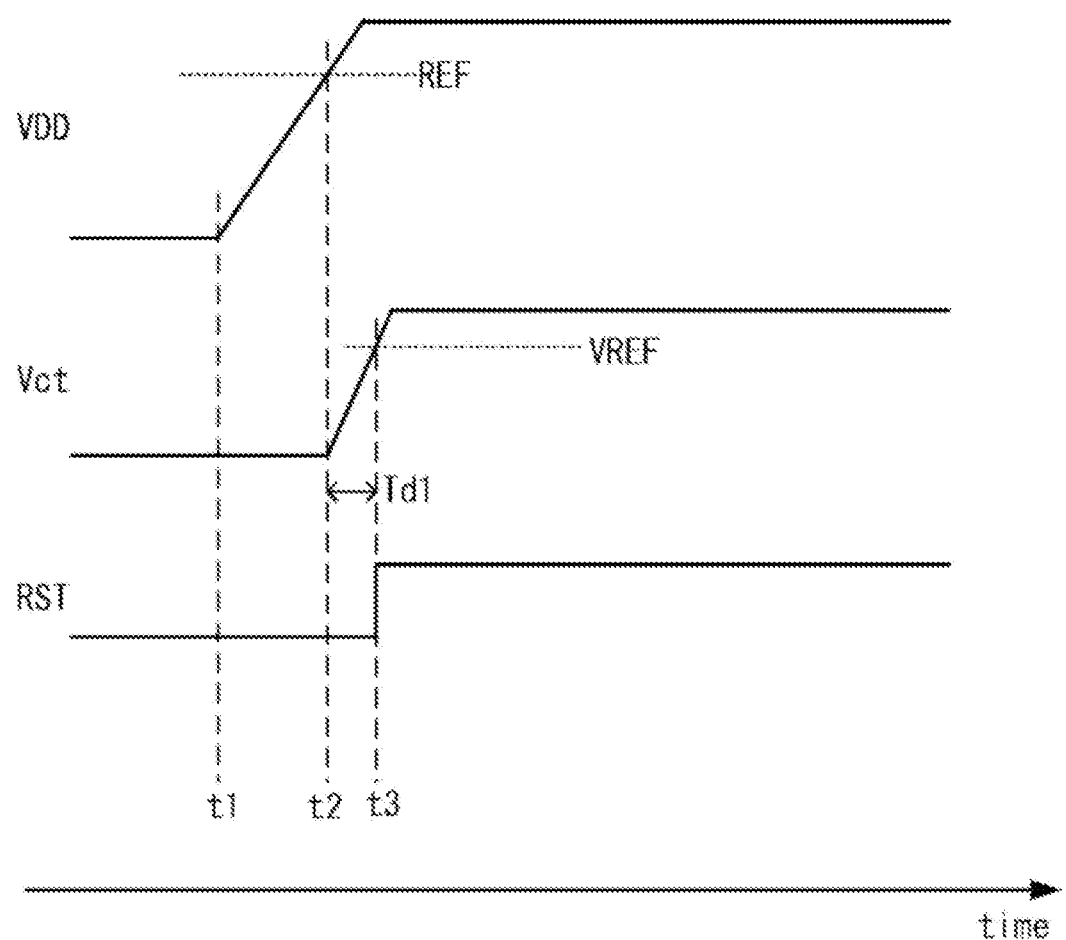
FIG. 2 is a timing chart showing an example of an operation of the semiconductor device according to the comparative example.

An operation of the semiconductor device 1 having such a configuration will be described by using a timing chart shown in FIG. 2. In FIG. 2, waveform examples of a power supply voltage VDD, a CT terminal voltage Vct, and a reset signal RST are shown in order from the top.

At timing t1, the power supply voltage VDD starts rising. At this time, a voltage (voltage at the node N1) Vd obtained by dividing the voltage of the SENSE terminal (that is, VDD) by the voltage divider resistors 2 and 3 is 0 V, and the output of the comparator 4 is at a high level. As a result, the constant current source 5A is in an off state, and the NMOS transistor 5B is in an on state. Therefore, the CT terminal voltage Vct is 0 V, the output of the comparator 7 is at a high level, and the NMOS transistor 8 is in an on state. Therefore, the reset signal RST output from the OUT terminal is at a low level.

Thereafter, the power supply voltage VDD reaches a predetermined reference voltage REF at timing t2. At this time, since the voltage Vd exceeds the reference voltage VREF, the output of the comparator 4 switches to a low level, the constant current source 5A switches to an on state, and the NMOS transistor 5B switches to an off state. As a result, charging of the capacitor 9 is started, and the CT terminal voltage Vct starts rising.

Thereafter, when the CT terminal voltage Vct reaches the reference voltage VREF at timing t3, the output of the comparator 7 switches to a low level, and the NMOS transistor 8 switches to an off state. Therefore, the reset signal RST switches to a high level. As a result, reset release is notified to the microcomputer or the like by the reset signal RST.

Herein, as shown in FIG. 1, the capacitor 9 is charged by a constant current I1 from the constant current source 5A, but due to a leakage current I2 flowing through the ESD protector 6, a current reduced from the constant current I1 by the leakage current I2 is supplied to the capacitor 9. As a result, a reset release delay time Td1 (between timings t2 and t3 in FIG. 2) from the start of charging of the capacitor 9 until the CT terminal voltage Vct reaches the reference voltage VREF may become longer. Since the leakage current I2 increases as a temperature increases, the reset release delay time Td1 varies depending on the temperature.

Figure 3:
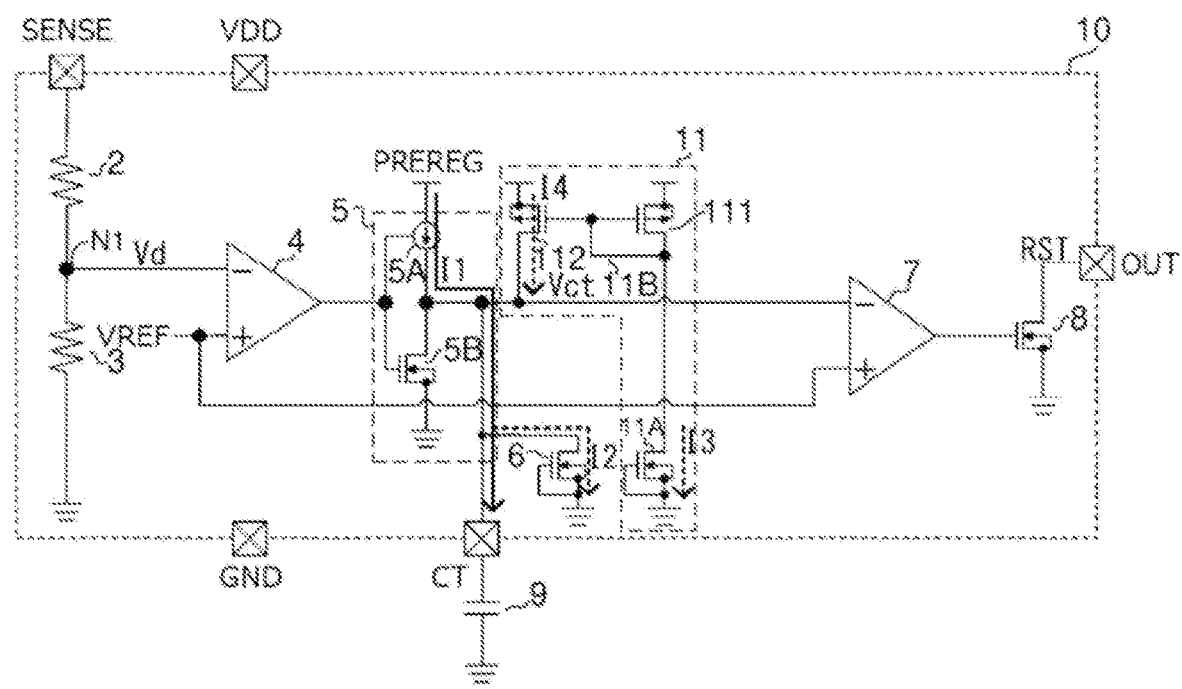
FIG. 3 is a diagram showing a configuration of a semiconductor device according to a first embodiment of the present disclosure.

The embodiments of the present disclosure are implemented to suppress variations in the reset release delay time Td1 due to temperature as described above. FIG. 3 is a diagram showing a configuration of a semiconductor device 10 according to the first embodiment of the present disclosure.

A structural difference between the semiconductor device 10 shown in FIG. 3 and the semiconductor device 1 according to the comparative example (FIG. 1) is that the semiconductor device 10 further includes a current injector 11. The current injector 11 includes a same component 11A and a current mirror 11B. The same component 11A is the same as the ESD protector 6 and includes an NMOS transistor whose gate and source are short-circuited. The current mirror 11B includes an input side transistor 111 and an output side transistor 112. The input side transistor 111 and the output side transistor 112 both include PMOS transistors (P channel MOSFETs). A source of the same component 11A is connected to the application end of the ground potential. A drain of the same component 11A is connected to the drain of the input side transistor 111. A gate and a drain of the input side transistor 111 are short-circuited. The gate of the input side transistor 111 and a gate of the output side transistor 112 are connected to each other. A source of the input side transistor 111 and a source of the output side transistor 112 are connected to an application end of the internal voltage PREREG. A drain of the output side transistor 112 is connected to the drain of the NMOS transistor 5B. That is, the drain of the output side transistor 112 is connected to a charging path configured to charge the capacitor 9 by the charger 5.

Figure 4:
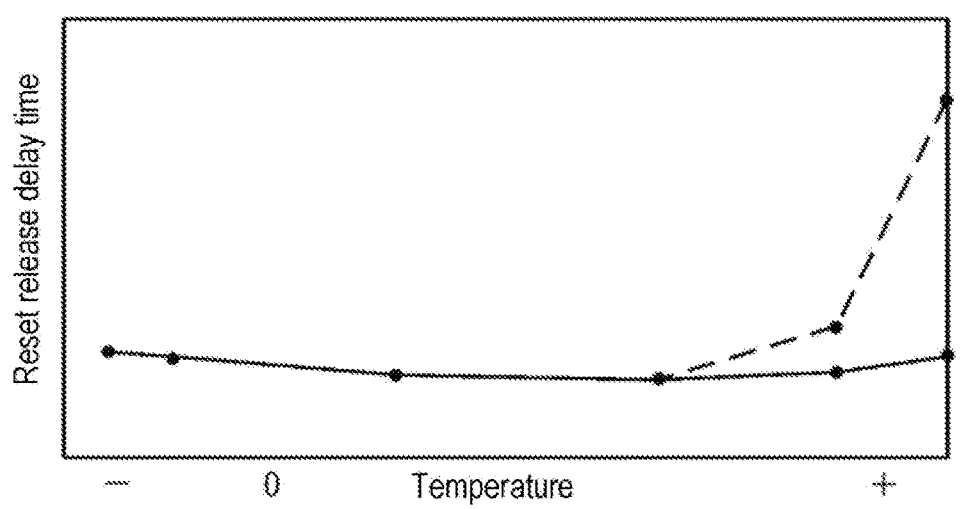
FIG. 4 is a graph showing an example in which temperature characteristics of a reset release delay time are compared between an embodiment (solid line) of the present disclosure and the comparative example (broken line).

According to this configuration, a leakage current I3 close to the leakage current I2 flowing through the ESD protector 6 flows through the same component 11A, the leakage current I3 is mirrored by the current mirror 11B, and a current I4 is injected into the charging path where charging is performed by the charger 5. Therefore, the leakage current I2 may be canceled by the current I4, variations in the current supplied to the capacitor 9 may be suppressed, and variations in the reset release delay time Td1 due to temperature may be suppressed. FIG. 4 is a graph showing an example in which temperature characteristics of the reset release delay time are compared between the embodiment (solid line) of the present disclosure and the comparative example (broken line). In this way, according to the embodiment of the present disclosure, it is possible to cancel an influence of the leakage current flowing through the ESD protector 6 at a high temperature, thereby improving the temperature characteristics of the reset release delay time.

Figure 5:
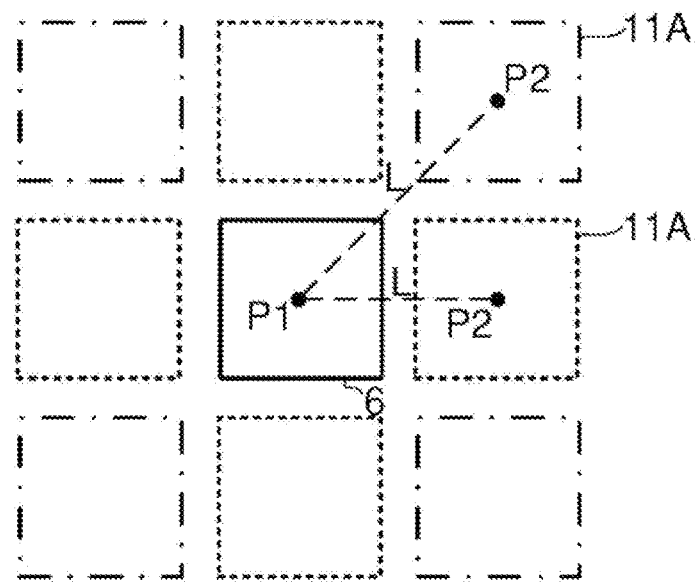
FIG. 5 is a diagram showing an example of a layout for an ESD protector of a same component.

FIG. 5 shows an example of a layout for the ESD protector 6 of the same component 11A. FIG. 5 is a plan view of a semiconductor substrate viewed from above. As shown in FIG. 5, it is desirable that the same component 11A be adjacent to the ESD protector 6 above, below, left, or right, as indicated by broken lines. Alternatively, it is desirable that the same component 11A be diagonally adjacent to the ESD protector 6, as indicated by dash-single dotted lines. Note that "adjacent" means that only the ESD protector 6 and the same component 11A are arranged as components on a line segment L connecting a geometric center position P1 of the ESD protector 6 and a geometric center position P2 of the same component 11A. By doing so, a leakage current flowing through the same component 11A may be made closer to the leakage current flowing through the ESD protector 6, and variations in the reset release delay time may be further suppressed. In FIG. 5, a shape of the component in a plan view is a quadrangular but is not limited thereto.

Further, for mirroring by the current mirror 11B, it is desirable that the input side transistor 111 and the output side transistor 112 are also adjacent to each other, similar to the above-described layout of the same component 11A and the ESD protector 6.

2. Second Embodiment

Figure 6:
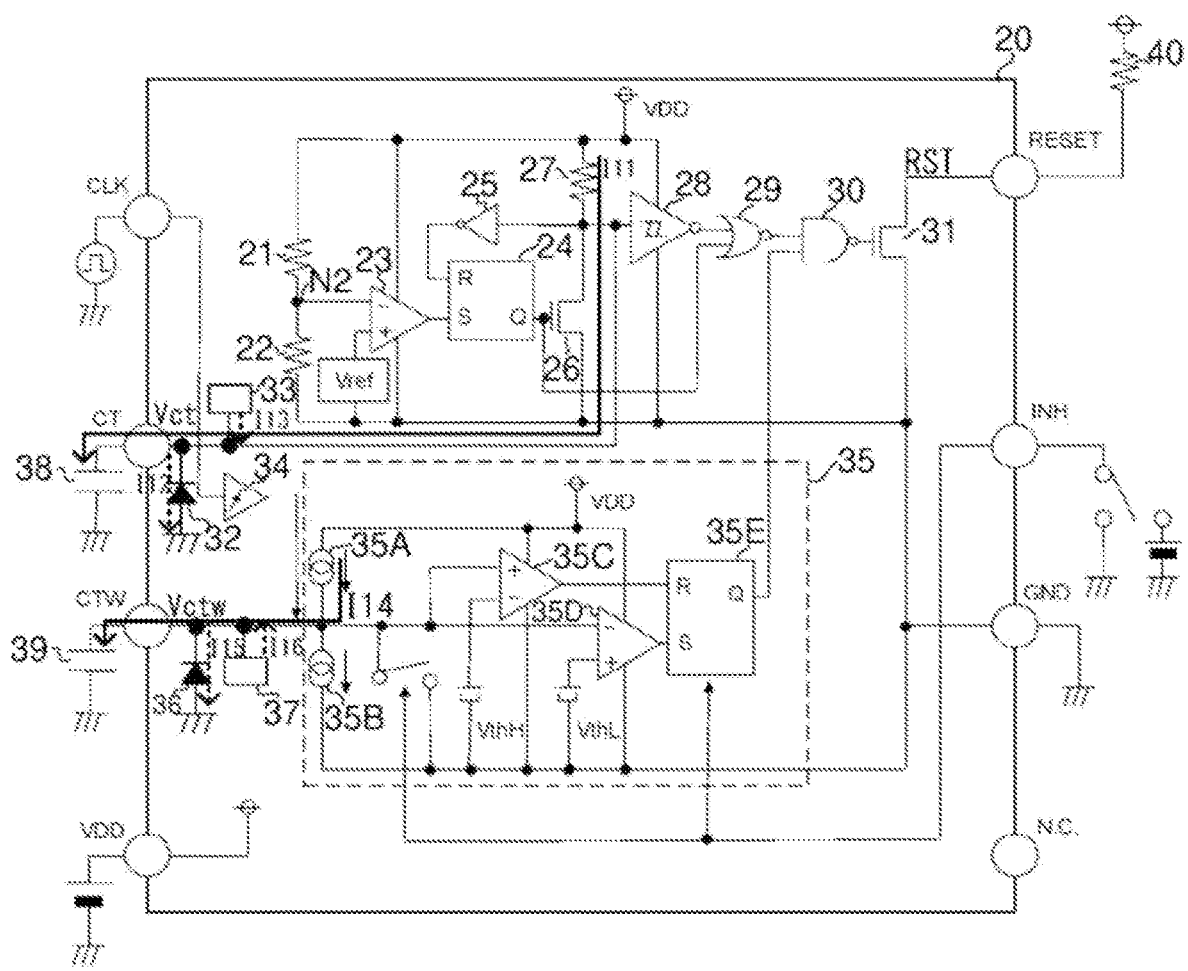
FIG. 6 is a diagram showing a configuration of a semiconductor device according to a second embodiment of the present disclosure.

FIG. 6 is a diagram showing a configuration of a semiconductor device 20 according to the second embodiment of the present disclosure. The semiconductor device 20 is a reset IC having an integrated internal configuration shown in FIG. 6, and is an IC with a watchdog timer function.

The semiconductor device 20 includes voltage divider resistors 21 and 22, a comparator 23, a flip-flop 24, an inverter 25, an NMOS transistor 26, a resistor 27, an inverter 28, a NOR circuit 29, a NAND circuit 30, an NMOS transistor 31, an ESD protector 32, and a current injector 33. Further, the semiconductor device 20 includes a pulse generator 34, a watchdog timer 35, an ESD protector 36, and a current injector 37.

The semiconductor device 20 also includes, as external terminals, a CLK terminal (clock terminal), a CT terminal (capacitor connection terminal), a CTW terminal (capacitor connection terminal), a VDD terminal (power supply terminal), a RESET terminal (reset terminal), an INH terminal (watchdog timer on/off setting terminal), and a GND terminal (ground terminal). The GND terminal is connected to an application end of a ground potential. The VDD terminal is connected to an application end of a power supply voltage VDD.

The voltage divider resistors 21 and 22 are connected in series between the application end of the power supply voltage VDD and the GND terminal. A node N2 to which the voltage divider resistors 21 and 22 are connected is connected to an inverting input end of the comparator 23. A non-inverting input end of the comparator 23 is connected to an application end of a reference voltage Vref. An output end of the comparator 23 is connected to a set terminal of the flip-flop 24. A Q output terminal of the flip-flop 24 is connected to a gate of the NMOS transistor 26. A source of the NMOS transistor 26 is connected to the GND terminal. The resistor 27 is connected between the application end of the power supply voltage VDD and a drain of the NMOS transistor 26. The drain of the NMOS transistor 26 is connected to an input end of the inverter 25. An output end of the inverter 25 is connected to a reset terminal of the flip-flop 24. The inverter 28 has a hysteresis. An input end of the inverter 28 is connected to the drain of the NMOS transistor 26. An output end of the inverter 28 is connected to a first input end of the NOR circuit 29. The Q output terminal of the flip-flop 24 is connected to a second input end of the NOR circuit 29.

The CT terminal is connected to the drain of the NMOS transistor 26. A capacitor 38 is externally connected to the CT terminal.

The watchdog timer 35 includes constant current sources 35A and 35B, comparators 35C and 35D, and a flip-flop 35E. The constant current source 35A is connected between the application end of the power supply voltage VDD and the CTW terminal. The constant current source 35B is connected between the CTW terminal and the GND terminal. The CTW terminal is connected to a non-inverting input end of the comparator 35C and also to an inverting input end of the comparator 35D. An inverting input end of the comparator 35C is connected to an application end of a reference voltage VthH. A non-inverting input end of the comparator 35D is connected to an application end of a reference voltage VthL. VthH is higher than VthL. An output end of the comparator 35C is connected to a reset terminal of the flip-flop 35E. An output end of the comparator 35D is connected to a set terminal of the flip-flop 35E.

A capacitor 39 is externally connected to the CTW terminal. The pulse generator 34 generates a pulse based on a clock signal CLK input to the CLK terminal.

An output end of the NOR circuit 29 is connected to a first input end of the NAND circuit 30. A Q output terminal of the flip-flop 35E is connected to a second input end of the NAND circuit 30. An output end of the NAND circuit 30 is connected to a gate of the NMOS transistor 31. A source of the NMOS transistor 31 is connected to the GND terminal. A drain of the NMOS transistor 31 is connected to the RESET terminal. A pull-up resistor 40 is externally connected to the RESET terminal.

The watchdog timer 35 may be turned on/off by setting the INH terminal to a high level or a low level.

Figure 7:
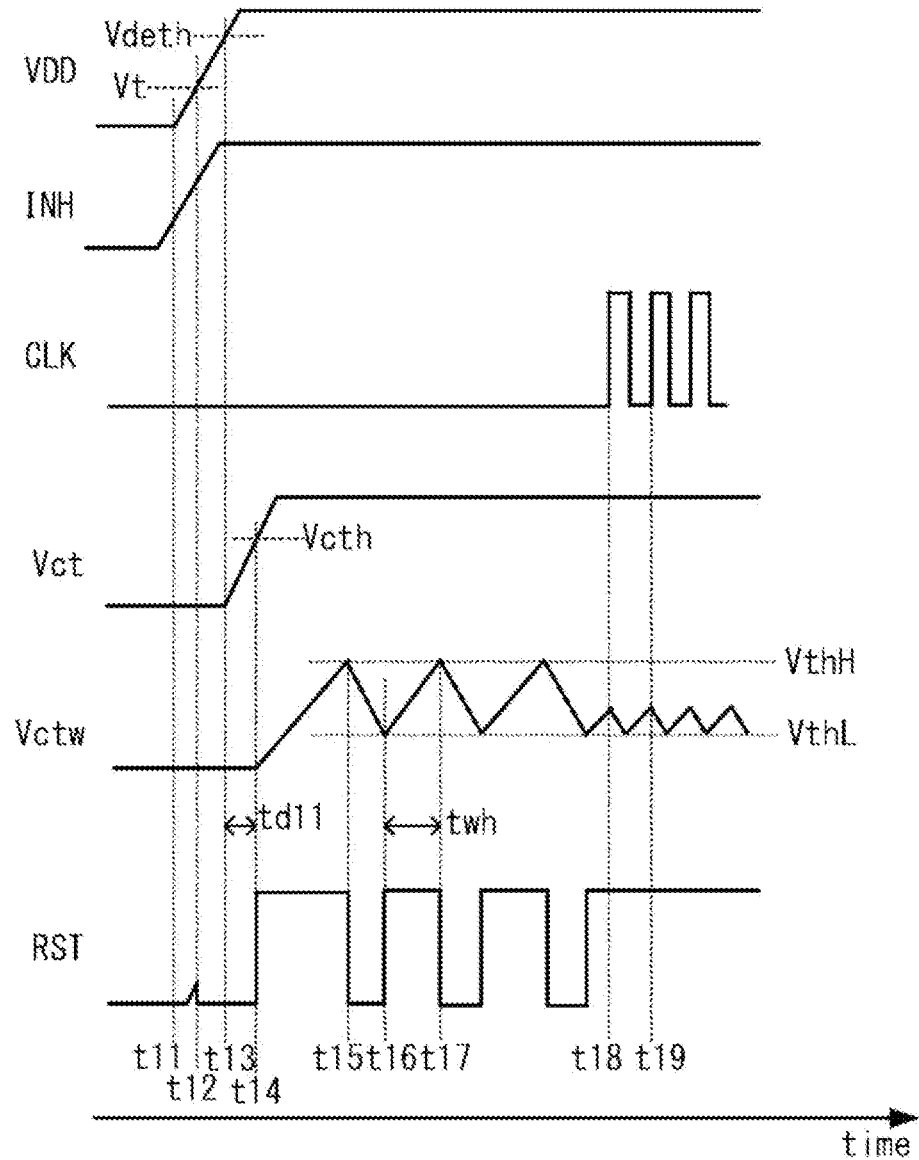
FIG. 7 is a timing chart showing an example of an operation of the semiconductor device according to the second embodiment.

An operation of the semiconductor device 20 having such a configuration will be described by using a timing chart shown in FIG. 7. In FIG. 7, waveform examples of a power supply voltage VDD, an INH terminal voltage, a clock signal CLK, a CT terminal voltage Vct, a CTW terminal voltage Vctw, and a reset signal RST are shown in order from the top.

First, at timing t11, the power supply voltage VDD starts rising. Thereafter, when the power supply voltage VDD reaches a predetermined voltage Vt at timing t12, the reset signal RST becomes a low level. Thereafter, when the power supply voltage VDD reaches a reset detection voltage Vdeth at timing t13, a voltage (voltage at the node N2) obtained by dividing the power supply voltage VDD by the voltage divider resistors 21 and 22 becomes equal to or higher than the reference voltage Vref, and the flip-flop 24 is reset. Then, the NMOS transistor 26 switches to an off state. As a result, charging of the capacitor 38 is started in a charging path from the application end of the power supply voltage VDD via the resistor 27 and the CT terminal. Therefore, the CT terminal voltage Vct starts rising.

Thereafter, when the CT terminal voltage Vct reaches a threshold voltage Vcth at timing t14, the output of the inverter 28 switches to a low level, and the NMOS transistor 31 switches to an off state. This causes the reset signal RST to switch to a high level. In this way, a reset release delay time td11 (between timings t13 and t14) occurs from when the power supply voltage VDD reaches the reset detection voltage Vdeth until the reset signal RST becomes the high level to release the reset.

When the reset signal RST rises to the high level, the constant current source 35A starts charging the capacitor 39 via the CTW terminal, and the watchdog timer 35 operates. As a result, the CTW terminal voltage Vctw starts rising. When the CTW terminal voltage Vctw reaches the reference voltage VthH at timing t15, the flip-flop 35E is reset and the NMOS transistor 31 switches to an on state. This causes the reset signal RST to switch to a low level. At this time, the capacitor 39 is switched to be discharged by the constant current source 35B. Therefore, the CTW terminal voltage Vctw starts falling.

Thereafter, when the CTW terminal voltage Vctw reaches the reference voltage VthL at timing t16, the flip-flop 35E is set and the NMOS transistor 31 switches to an off state. This causes the reset signal RST to switch to a high level. At this time, the capacitor 39 is switched to be charged by the constant current source 35A. Therefore, the CTW terminal voltage Vctw starts rising again.

Thereafter, when the CTW terminal voltage Vctw reaches the reference voltage VthH at timing t17, the reset signal RST switches to a low level. The time from when the CTW terminal voltage Vctw starts rising until the CTW terminal voltage Vctw reaches the reference voltage VthH is a watchdog time twh. As at timings t18 and t19, when the clock signal CLK rises before the watchdog time twh elapses after the CTW terminal voltage Vctw starts rising, the capacitor 39 is switched to be discharged by the constant current source 35B, and the CTW terminal voltage Vctw starts falling. At this time, the reset signal RST is maintained at the high level. In other words, the reset release is maintained.

Here, the ESD protector 32 is connected to the CT terminal. The capacitor 38 is charged by a current I11 flowing through a charging path via the application end of the power supply voltage VDD, the resistor 27, and the CT terminal, but a leakage current I12 flows through the ESD protector 32. Therefore, the current injector 33 is provided. The current injector 33 includes the same component as the ESD protector 32 and injects a current I13 based on the current flowing through the component into the charging path. As a result, the leakage current I12 may be canceled and variations in the reset release delay time td11 due to temperature may be suppressed.

Further, the ESD protector 36 is connected to the CTW terminal. Although the capacitor 39 is charged by a current I14 flowing through the charging path via the constant current source 35A and the CTW terminal, a leakage current I15 flows through the ESD protector 36. Therefore, the current injector 37 is provided. The current injector 37 includes the same component as the ESD protector 36 and injects a current based on the current flowing through the component into the charging path. As a result, the leakage current I15 may be canceled and variations in the watchdog time twh due to temperature may be suppressed.

3. Third Embodiment

Figure 8:
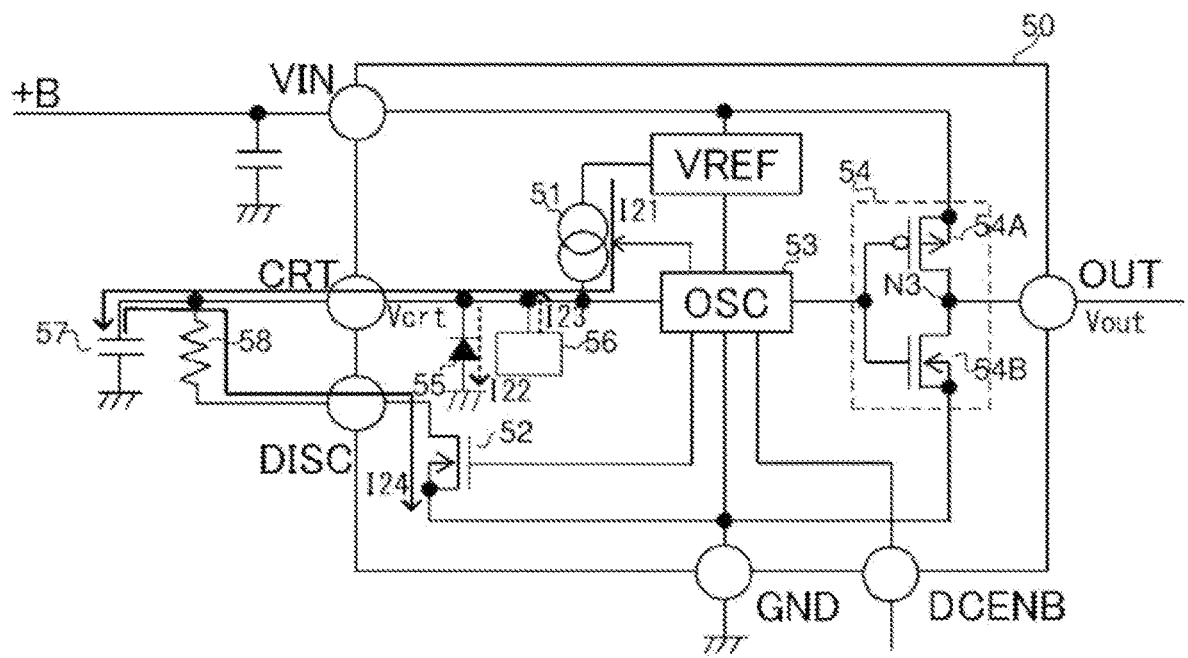
FIG. 8 is a diagram showing a configuration of a semiconductor device according to a third embodiment of the present disclosure.

FIG. 8 is a diagram showing a configuration of a semiconductor device 50 according to a third embodiment of the present disclosure. The semiconductor device 50 is a timer IC having an integrated internal configuration shown in FIG. 8.

The semiconductor device 50 includes a constant current source 51, an NMOS transistor (switch) 52, an oscillator 53, an output stage 54, an ESD protector 55, and a current injector 56. The semiconductor device 50 also includes, as external terminals, a VIN terminal (power supply terminal), a CRT terminal (capacitor connection terminal), a DISC terminal (discharging terminal), a GND terminal (ground terminal), a DCENB terminal (DC enable terminal), and an OUT terminal (output terminal). The VIN terminal is connected to an application end of a power supply voltage. The GND terminal is connected to an application end of a ground potential.

A capacitor 57 and a first end of a resistor 58 are externally connected to the CRT terminal. The constant current source 51 is connected to the CRT terminal. A second end of the resistor 58 is connected to the DISC terminal. A drain of the NMOS transistor 52 is connected to the DISC terminal. A source of the NMOS transistor 52 is connected to the GND terminal. The oscillator 53 controls the output stage 54 according to a CRT terminal voltage Vcrt. The output stage 54 includes a PMOS transistor 54A and an NMOS transistor 54B. A source of the PMOS transistor 54A is connected to the VIN terminal. A drain of the PMOS transistor 54A is connected to a drain of the NMOS transistor 54B. A source of the NMOS transistor 54B is connected to the GND terminal. A node N3 to which the PMOS transistor 54A and the NMOS transistor 54B are connected is connected to the OUT terminal. Gates of the PMOS transistor 54A and the NMOS transistor 54B are complementarily controlled by the oscillator 53. That is, when the PMOS transistor 54A is in an on state, the NMOS transistor 54B is controlled to be in an off state, and when the PMOS transistor 54A is in an off state, the NMOS transistor 54B is controlled to be in an on state. Further, the oscillator 53 also controls the on/off of the constant current source 51 and the on/off of the NMOS transistor 52.

Figure 9:
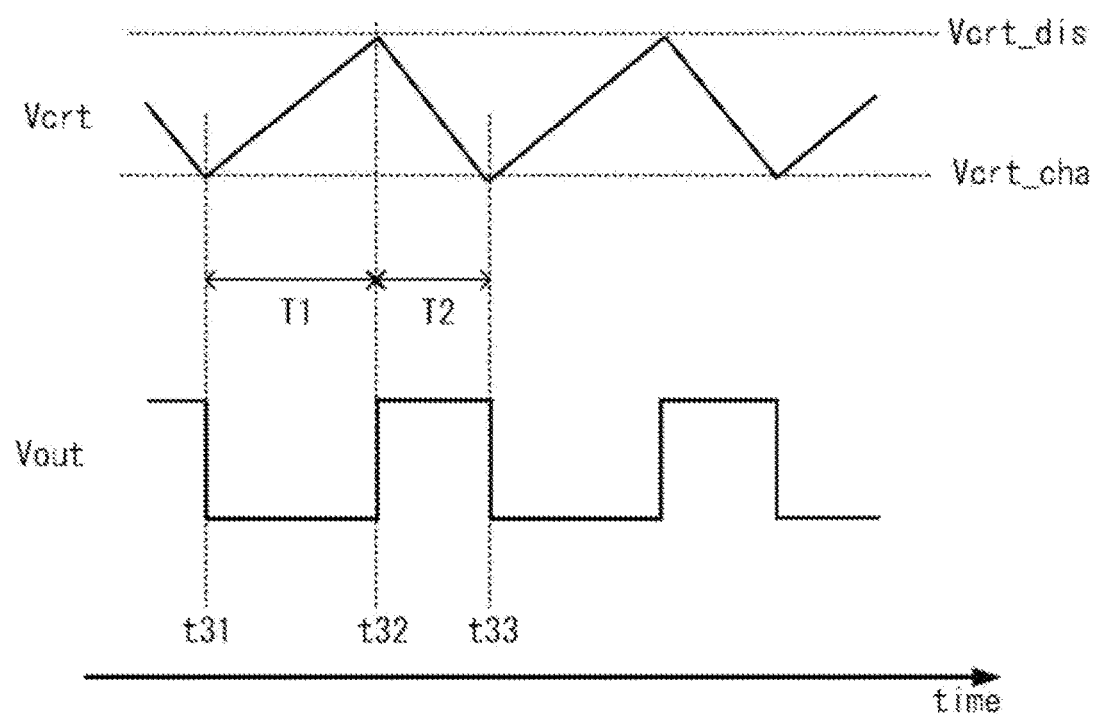
FIG. 9 is a timing chart showing an example of an operation of the semiconductor device according to the third embodiment.

An operation of the semiconductor device 50 having such a configuration will be described by using a timing chart shown in FIG. 9. In FIG. 9, waveform examples of a CRT terminal voltage Vcrt and an output voltage Vout, which is a voltage of the OUT terminal, are shown in order from the top.

At timing t31, the oscillator 53 turns off the NMOS transistor 52 and turns on the constant current source 51, starts charging of the capacitor 57 via the CRT terminal, and starts increasing the CRT terminal voltage Vcrt. At this time, the output voltage Vout is controlled to a low level by the oscillator 53. Thereafter, when the CRT terminal voltage Vcrt reaches a predetermined discharging threshold voltage Vcrt_dis at timing t32, the oscillator 53 switches the constant current source 51 to an off state and the NMOS transistor 52 to an on state, starts discharging of the capacitor 57 via the DISC terminal, and starts decreasing the CRT terminal voltage Vcrt. At this time, the output voltage Vout is controlled to a high level by the oscillator 53. Thereafter, when the CRT terminal voltage Vcrt reaches a predetermined charging threshold voltage Vcrt_cha at timing t33, the oscillator 53 switches the constant current source 51 to an on state and the NMOS transistor 52 to an off state, starts charging of the capacitor 57, and starts increasing the CRT terminal voltage Vcrt. At this time, the output voltage Vout is controlled to a low level by the oscillator 53. Thereafter, similar operations are repeated, the CRT terminal voltage Vcrt is controlled to a triangular wave, and a pulsed output voltage Vout is output from the OUT terminal.

Here, the ESD protector 55 is connected to the CRT terminal. The capacitor 57 is charged by a current I21 flowing through a charging path via the constant current source 51 and the CRT terminal, but a leakage current I22 flows through the ESD protector 55. Therefore, the current injector 56 is provided. The current injector 56 includes the same component as the ESD protector 55 and injects a current I23 based on the current flowing through the component into the charging path. As a result, the leakage current I22 may be canceled and variations in a rising time T1 (FIG. 9) of the CRT terminal voltage Vcrt due to temperature may be suppressed. Further, when the capacitor 57 is discharged, a discharge current I24 flows through the NMOS transistor 52, but since the leakage current I22 flowing through the ESD protector 55 is canceled by the current I23, variations in a falling time T2 (FIG. 9) of the CRT terminal voltage Vcrt due to temperature may be suppressed.

4. Others

The various technical features disclosed in the present disclosure may be modified in various ways in addition to the above-described embodiments without departing from the gist of the technical concept. That is, the above-described embodiments should be considered to be illustrative in all respects and not restrictive, and it should be understood that the technical scope of the present disclosure is not limited to the above-described embodiments, but includes all changes that fall within the meaning and range equivalent to the claims.

5. Supplementary Notes

As described above, for example, a semiconductor device (10) according to an aspect of the present disclosure has a configuration that it includes:
  a capacitor connection terminal (CT terminal) configured to enable an external connection of a capacitor (9);
  a charger (5) configured to charge the capacitor;

an ESD protector (6) connected to the capacitor connection terminal; and
a current injector (11) including a same component (11A) which is the same as the ESD protector and is configured to inject a current based on a leakage current flowing through the same component into a charging path where charging is performed by the charger (first configuration).

Further, the semiconductor device (10) of the first configuration may have a configuration that only the ESD protector and the same component are arranged as components on a line (L) connecting a geometric center position of the ESD protector (6) and a geometric center position of the same component (11A) in a plan view (second configuration).

Further, the semiconductor device (10) of the first or second configuration may have a configuration that the current injector (11) includes a current mirror (11B) configured to mirror the leakage current and inject the mirrored leakage current into the charging path (third configuration).

Further, the semiconductor device (10) of the third configuration may have a configuration that the current mirror (11B) includes an input side transistor (111) connected to the same component (11A) and an output side transistor (112) connected to the charging path, and
wherein the input side transistor and the output side transistor are arranged adjacent to each other in a plan view (fourth configuration).

Further, the semiconductor device (10) of any one of the first to fourth configurations may have a configuration that it further includes:
an output terminal (OUT terminal) configured to be capable of outputting a reset signal; and
an output switch (8) connected to the output terminal,
wherein the charger (5) is configured to start charging when a power supply voltage (VDD) reaches a predetermined voltage, and
wherein the output switch is controlled based on a voltage of the capacitor connection terminal (CT terminal) (fifth configuration).

Further, the semiconductor device (10) of the fifth configuration may have a configuration that it further includes:
a detection terminal (SENSE terminal) configured to enable a connection of an application end of the power supply voltage; and
a first comparator (4) configured to receive a voltage obtained by dividing a voltage of the detection terminal and a reference voltage (VREF),
wherein the charger (5) includes a constant current source (5A) and a switch (5B) connected to the constant current source, and
wherein the constant current source and the switch are controlled to be turned on or off based on an output of the first comparator (sixth configuration).

Further, the semiconductor device (10) of the sixth configuration may have a configuration that it further includes:
a second comparator (7) configured to receive the voltage (Vct) of the capacitor connection terminal and the reference voltage (VREF) and to control the output switch (8) to be turned on or off (seventh configuration).

Further, the semiconductor device (10) of any one of the first to fourth configurations may have a configuration that it further includes: a watchdog timer (35) configured to set a watchdog time for monitoring a clock input by the capacitor (39) (eighth configuration).

Further, the semiconductor device (50) of any one of the first to fourth configurations may have a configuration that the charger includes a constant current source (51) connected to the capacitor connection terminal (CRT terminal), and
the semiconductor device (50) further includes:
a discharging terminal (DISC terminal) configured to be capable of being connected to the capacitor connection terminal via a resistor (58);
a switch (52) connected to the discharging terminal;
an output terminal (OUT terminal);
an output stage (54) connected to the output terminal; and
an oscillator (53) configured to control the constant current source and the second switch to be turned on or off and control the output stage (ninth configuration).

INDUSTRIAL APPLICABILITY

The present disclosure can be used for a reset IC, a timer IC, etc. for various purposes.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device comprising:
a capacitor connection terminal configured to enable an external connection of a capacitor;
a charger configured to charge the capacitor;
an ESD protector connected to the capacitor connection terminal; and
a current injector including a same component which is the same as the ESD protector and is configured to inject a current based on a leakage current flowing through the same component into a charging path where charging is performed by the charger.

2. The semiconductor device of claim 1, wherein only the ESD protector and the same component are arranged as components on a line connecting a geometric center position of the ESD protector and a geometric center position of the same component in a plan view.

3. The semiconductor device of claim 1, wherein the current injector includes a current mirror configured to mirror the leakage current and inject the mirrored leakage current into the charging path.

4. The semiconductor device of claim 3, wherein the current mirror includes an input side transistor connected to the same component and an output side transistor connected to the charging path, and
wherein the input side transistor and the output side transistor are arranged adjacent to each other in a plan view.

5. The semiconductor device of claim 1, further comprising:
an output terminal configured to be capable of outputting a reset signal; and
an output switch connected to the output terminal,
wherein the charger is configured to start charging when a power supply voltage reaches a predetermined voltage, and wherein the output switch is controlled based on a voltage of the capacitor connection terminal.

6. The semiconductor device of claim 5, further comprising:
a detection terminal configured to enable a connection of an application end of the power supply voltage; and
a first comparator configured to receive a voltage obtained by dividing a voltage of the detection terminal and a reference voltage,
wherein the charger includes a constant current source and a switch connected to the constant current source, and
wherein the constant current source and the switch are controlled to be turned on or off based on an output of the first comparator.

7. The semiconductor device of claim 6, further comprising: a second comparator configured to receive the voltage of the capacitor connection terminal and the reference voltage and to control the output switch to be turned on or off.

8. The semiconductor device of claim 1, further comprising: a watchdog timer configured to set a watchdog time for monitoring a clock input by the capacitor.

9. The semiconductor device of claim 1, wherein the charger includes a constant current source connected to the capacitor connection terminal, and
wherein the semiconductor device further comprises:
a discharging terminal configured to be capable of being connected to the capacitor connection terminal via a resistor;
a switch connected to the discharging terminal;
an output terminal;
an output stage connected to the output terminal; and
an oscillator configured to control the constant current source and the switch to be turned on or off and to control the output stage.

* * * * *